Figure 1A:
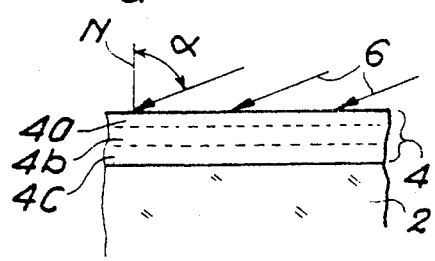

United States Patent [19]

Carenco et al.

[11] Patent Number: 4,938,836

[45] Date of Patent: Jul. 3, 1990

[54] PROCESS FOR LOCALLY INCREASING THE REFRACTIVE INDEXES OF AN ELECTROOPTICAL MATERIAL USABLE IN GUIDED OPTICS AND MATERIAL OBTAINED BY THIS PROCESS

[75] Inventors: Alain Carenco, Bourg la Reine; Elchuri Rao, Issy les Moulineaux; Sylvie Fouchet, Paris, all of France

[73] Assignee: Etat Francais represente par le Ministre Delegue aux Postes et Telecommunications, Issy Les Moulineaux, France

[21] Appl. No.: 172,150

[22] Filed: Mar. 23, 1988

[51] Int. Cl.$^5$ .............................................. C30B 31/22
[52] U.S. Cl. ................................... 156/605; 156/603; 156/606; 156/DIG. 71; 156/DIG. 73; 156/DIG. 87; 427/162; 350/96.14
[58] Field of Search ....... 156/603, 605, 606, DIG. 71, 156/DIG. 73, DIG. 87; 427/162; 350/96.14; 704/192

[56] References Cited

U.S. PATENT DOCUMENTS

| | | | |
|---|---|---|---|
| 3,533,755 | 10/1970 | Ballman et al. | 156/DIG. 87 |
| 3,565,577 | 2/1971 | Nassau et al. | 136/DIG. 87 |
| 3,997,687 | 12/1976 | Phillips | 427/162 |
| 4,037,005 | 7/1977 | Phillips | 427/162 |
| 4,056,304 | 11/1977 | Phillips | 427/162 |
| 4,073,675 | 2/1978 | Ballman et al. | 156/DIG. 87 |
| 4,100,313 | 7/1978 | Hammer et al. | 427/162 |
| 4,203,649 | 5/1980 | Velasco et al. | 350/96.14 |
| 4,348,074 | 9/1982 | Burns et al. | 350/96.12 |
| 4,439,265 | 3/1984 | Alferness et al. | 156/606 |
| 4,465,337 | 8/1984 | Baron et al. | 427/162 |
| 4,547,262 | 10/1985 | Spillman, Jr. et al. | 350/96.12 |

FOREIGN PATENT DOCUMENTS 2626516 12/1977 Fed. Rep. of Germany ... 350/96.14

OTHER PUBLICATIONS

Physica Status Solidi (A), vol. 88, No. 1, 1985, pp. 193–205, Naden.
Journal of Applied Physics, vol. 50, No. 12, Dec. 1979.
Journal of Lightwave Technology, vol. LT-3, No. 4, Aug. 1985.
Carter et al., "Ion Implantation of Semiconductors", John Wiley & Sons, New York, Halsted Press Book, 1976, pp. 68–73.
Grayson, "Encyclopedia of Semiconductor Technology", John Wiley and Sons, New York, 1984, pp. 397–400.

Primary Examiner—John Doll
Assistant Examiner—Robert M. Kunomuno
Attorney, Agent, or Firm—Nutter, McClennen & Fish

[57] ABSTRACT

Process for locally increasing the refractive indexes of an electrooptical material usable in guided optics and material obtained by this process.

The process according to the invention consists of carrying out an implantation of ions (6) of sulphur or a metallic dopant able to take the place of a cation of the crystal lattice of the ferroelectric material (2), followed by annealing at between 300° and 600° C. in order to rearrange the crystal lattice disturbed during implantation and for activating the implanted ions. Ion implantation is carried out in an inclined direction (60) with respect to the normal to the surface of the monocrystalline material (2). For a $LiNbO_3$ monocrystal, use is made of Ti ions as the dopant. This process makes it possible to produce a guide layer (4) having ordinary and extraordinary refractive indices above those of the pure monocrystal.

17 Claims, 3 Drawing Sheets

PROCESS FOR LOCALLY INCREASING THE REFRACTIVE INDEXES OF AN ELECTROOPTICAL MATERIAL USABLE IN GUIDED OPTICS AND MATERIAL OBTAINED BY THIS PROCESS

The present invention relates to a process for locally increasing the refractive indices or indexes of a ferroelectric monocrystalline material having electrooptical properties. It is used in the field of guided optics for producing light guides and discrete or integrated optical components such as lenses, electrooptical modulators, defraction gratings and multiplexers.

The remote information transmission and/or processing methods studied for several years, particularly in the telecommunications field, make use of transmission by light waves in light guides having a planar structure. These light guides are constituted by a guide layer, inserted between two media having refractive indexes lower than that or those of the guide layer. One of the media is generally constituted by air.

With each monomode optical guide is associated an effective index $n_{eff}=c/v$, in which v represents the light propagation speed in the guide layer and c the light propagation speed in the vacuum. The value of the effective index is dependent on the value of the different indexes of the layers constituting the light guide, as well as their thickness. Thus, in guided optics, the speed of a lightwave can be modified either by variations of the indexes of the different layers present, or by variations in their thickness.

Among the ferroelectric materials which consequently have electrooptical properties, lithium niobate ($LiNbO_3$) is at present the most widely used material in guided optics. It is a uniaxial and therefore birefringent crystal having two main indexes, one in accordance with the axis of the crystal, called the extraordinary index $n_e$ and the other in a plane perpendicular to the former and called the ordinary index $n_o$.

At present there are three methods for locally modifying the refractive indexes $n_e$ and $n_o$ of a lithium niobate monocrystal.

The first method involves the diffusion of a metallic dopant into the monocrystal. This method consists of depositing on the surface of the crystal a metallic dopant layer with a thickness of a few nanometres (50 to 100 nm), then subjecting the assembly to annealing for a few hours at a temperature close to 1000° C. to permit the diffusion of the metallic dopant into the monocrystal. This method is in particular described in an article in Appl. Phys. Lett., vol. 25, no. 8, pp. 458-460, 1974, entitled "Metal-Diffused Optical Waveguides in LiNbO₃" by R. V. Schmidt.

The diffusion of dopant ions is generally performed under an oxygen, argon or nitrogen atmosphere.

This diffusion method makes it possible to produce on the surface of the $LiNbO_3$ of a guide layer having an increase of at the most $+2 \cdot 10^{-2}$ of the extraordinary index and at the most $+10^{-2}$ of the ordinary index compared with the undoped crystal. This method makes it possible to directly obtain surface optical guides, which are completely stable and have low light propagation losses (approximately 0.1 dB/cm). Moreover, these guides can be used in all polarizations of light. The guide layer is relatively deep and has a thickness of typically 3 to 20 micrometers.

The diffusion method uses metallic dopants, i.e. atoms liable to take the place of a cation of the crystal lattice of the material. In other words, the diffusion of dopants locally modifies the composition of the monocrystal. The dopants used are in particular titanium, gold, silver, iron, cobalt, niobium, copper, tantalum, vanadium and nickel for a $LiNbO_3$ monocrystal and titanium, niobium and copper for a $LiTaO_3$ monocrystal.

This diffusion method, which is presently that most widely used for producing optical guides suffers from a certain number of disadvantages.

In particular, this method only makes it possible to obtain index gradient guides, the dopant diffusing to a varying extent and relatively deeply into the monocrystal. It does not make it possible to produce index jump or hopping guides, i.e. guides having a guide layer with clearly defined refractive indexes compared with those of the undoped monocrystal and with a finite thickness. The diffusion profile of the dopants is a function of the annealing temperature, the annealing time and the thickness of the deposited dopant layer. It consequently has no abrupt frontier in the substrate.

Moreover, as a result of the significant lateral diffusion, the diffusion method in particular does not make it possible to produce defractive gratings, whereof the spacing or pitch varies from 0.1 to 0.4 micrometer. Moreover, the increase in the ordinary and extraordinary indexes is small (approximately $10^{-2}$). This is in particular due to the limited quantity of dopants liable to be introduced into the monocrystal by diffusion.

The second method used for locally modifying the refractive indexes of a material involves exchanges of ions, which can all be likened to a proton exchange. This method is in particular described in an article in Optics Letters, vol. 8, no. 2, February 1983, pp. 114-115, entitled "Independent Control of Index and Profiles in Proton-Exchanged Lithium Niobate Guides" by M. de Micheli et al.

Unlike the previous method, this method makes it possible to produce waveguides with index hopping. Moreover, this method makes it possible to significantly increase the extraordingly index of lithium niobate (+0.12). However, the guidance of the light cannot use the polarization corresponding to the extra-ordinary index $n_o$ of the material, because the variation of said index is negative (approximately $-0.05$).

In addition, the guides obtained suffer from the disadvantage of being unstable in time. Reference can be made in this connection to the article in Appl. Phys. Lett., vol. 42, no. 8, 15.4.1983, pp. 633-635, entitled "Index Instabilities in Proton-Exchanged LiNbO₃ Waveguides" by Alfredo Yi-Yan.

The third method used in guided optics is the ion implantation of various impurities, such as the following ions: $H^+$, $He^+$, $B^+$, $N^+$, $O^+$, $Ne^+$, $P^+$, $Ar^+$. This ion implantation method is in particular described in the article in J. Appl. Phys., 50(12), December 1979, pp. 7898-7905, by J. L. Destefanis, entitled "The Formation of Waveguides and Modulators in $LiNbO_3$ by Ion Implantation", and in the article in the Journal of Lightwave Technology, vol. LT-3, no. 4, August 1985, pp. 855-858, by J. Mark Naden et al, entitled "Optical Properties of Planar Waveguides Formed by He⁺ Implantation in $LiNbO_3$".

The ion implantation of impurities produces faults in the crystal lattice, leading to an increase in the crystal mesh as a result of the disorder produced. It also leads to a reduction in both the ordinary and extraordinary indexes in a buried or embedded layer of the monocrystal. The guide layer is then defined between the layer implanted in the material and the air.

Ion implantation has the advantage of permitting both a precise localization of the buried layer and a good control of the quantity of impurities introduced into said layer, unlike in diffusion. Thus, it makes it possible to produce index jump optical guides.

In order to rearrange the crystal lattice of the guide layer, disturbed during implantation, the latter is generally followed by annealing at between 200° and 400° C. Annealing at a higher temperature and in particular at 600° C. lead to a curing or healing of the faults of the implanted layer, cancelling out the refractive index variation obtained during implantation and therefore destroying the optical guide. This can be clearly gathered from the aforementioned article by Destefanis.

Unlike the two first-mentioned methods, the implantation method only permits a reduction of the refractive indexes considerably limiting the use thereof for producing optical components and/or guides. In particular, this method does not make it possible to increase the ordinary and extraordinary refractive indexes on the surface of the substrate.

Both the diffusion and implantation methods, which involve heating stages, generally lead to an exodiffusion of lithium. This exodiffusion leads to an increase in the extraordinary index on the surface of the material, whereas the ordinary index is not modified. This significantly contributes to an increase in the extraordinary index in the diffusion method.

However, this exodiffusion compensates the reduction in the extraordinary index due to ion implantation, which cancels out the objective of the implantation for the extraordinary index, while the ordinary index remains negative. Furthermore, following the annealing of the implanted material, the implanted region of the material remains the seat of a lithium migration at a significant level, even at ambient temperature, so that not very time-stable optical guides are obtained.

The lithium exodiffusion phenomenon in the case of an implantation of impurities followed by annealing is in particular described in an article in Phys. Stat. Sol.(a) 88, 193, 1985, pp. 193–205 and entitled "Diffusion and Recrystallization Processes during Annealing of N and P Implanted $LiNbO_3$", by S. Jetschke.

Moreover, the ion implantation method envisages the implantation of metal ions, particularly of titanium and silver in lithium niobate, as described in the aforementioned Destefanis article. This implantation is followed by high temperature annealing and in particular at 970° C., as can be gathered from the Destefanis thesis given to the Grenoble Scientific and Medical University and the Grenoble National Polytechnical Institute on 26.9.1978 and entitled "Etude de la Modification des Propriétés Optiques Induites par Implantation Ionique dans le $LiNbO_3$ Application à la Réalisation de Guides d'Ondes".

This ion implantation, followed by high temperature annealing, made it possible to increase the extraordinary index of the monocrystalline $LiNbO_3$ on the surface in a manner identical to that obtained by the conventional method of diffusing titanium into said substrate.

In this process, the surface layer implanted under low energy (130 keV) and being unable to permit the propagation of light because the index is lower than the substrate, only served as a titanium diffusion source. Titanium is not left in the implantation site and under the effect of the high temperature migrated, while diluting over a depth of several meter, in the same way as during a diffusion from a thin titanium film deposited on the surface of the monocrystal.

Therefore the present invention relates to a process for locally increasing the refractive indexes of an electrooptical material making it possible obviate the disadvantages referred to hereinbefore. This increase, which relates to all or part of the electrooptical material, makes it possible to directly produce an optical guide, as well as bringing about a local disturbance of indexes of the guide layer, thus permitting the production of optical components.

Unlike in the method of diffusing a metallic dopant, this process makes it possible to produce index hopping guides with a good optical quality and having significant increase in the indexes of the ferroelectric material of at least +0.1.

Moreover, unlike in the impurity implantation method, it makes it possible to produce optical guides having time-stable optical properties and usable for all light polarizations.

More specifically, the invention relates to a process for locally increasing the refractive indexes of a ferroelectric monocrystalline material, characterized in that it comprises (a) at least one ion implantation of sulphur or a metallic dopant able to take the place of a cation of a crystal lattice of the material, said implantation being performed under vacuum and (b) an annealing of the implanted material, at a temperature between 300° and 600° C., in order to rearrange the crystal lattice disturbed during implantation and activate the implanted ions, while preventing the diffusion thereof into the material.

Sulphur is able to take the place of the anion of the crystal lattice of the ferroelectric material, when it has a negative degree of oxidation and to take the place of a cation of said lattice when it has a positive degree of oxidation.

This process makes it possible to simultaneously increase the different refractive indexes of a monocrystalline material over a very limited depth, unlike in the case of the diffusion of dopants. Moreover, the index profile obtained is uniform and very localized with a higher amplitude than that obtained with the diffusion method. Thus, the objective sought by the invention is to obtain a high concentration of dopants in a limited thickness of the monocrystalline material, which is not possible by conventional thermal diffusion. Ion implantation permits placing out of thermodynamic equilibrium.

Ion implantation of the metallic dopant or the sulphur according to the invention creates defects within the monocrystalline material, so as to initially bring about a drop in the indexes of the monocrystalline material. Annealing at between 300° and 600° C. makes it possible to cure or heal these implantation defects leading to a compensation of this reduction of the refractive indexes during implantation, followed by an increase thereof as a result of the activation of the implanted ions. This activation consists of placing implanted dopants at a substitutional position in sites and/or vacancies of the newly ordered crystal lattice.

The increase in the refractive indexes rises with the annealing temperature in the temperature range in question, contrary to what was obtained with the implantation of impurities according to the prior art.

The implanted dopant ions according to the invention must be able to increase the electronic polarizability of the ferroelectric material in the wavelength range envisaged for the use of the optical guide (visible to near infrared) and/or decrease the volume of the crystal mesh and not to produce an absorption band in the transmission range of the light in question.

According to the invention, the annealing temperature is between 300° and 600° C. A temperature below 300° C. only makes it possible to cure defects created in the crystal material during implantation, the activation of the implanted ions not taking place.

Moreover, although a temperature above 600° C. could be used with a view to bringing about a maximum increase in the refractive indexes, an excessively high temperature would lead to an excessive diffusion of the ions implanted within the material cancelling out the effects sought by the implantation (index jump). Moreover, an increase in the temperature to above 600° C. can lead, as a function of the material used, to a surface decomposition thereof and/or to a loss of its electrooptical properties as a result of disorientation of the dipole moments when annealing at a temperature above the Curie point. Advantageously, annealing takes place under an oxygen atmosphere, in order to avoid a surface reduction of the monocrystal.

In order to improve the efficiency of implantation, it is possible to carry out during implantation a moderate heating of the material or, conversely, a cooling down to the temperature of liquid nitrogen (77° K.) as a function of the dopant and/or monocrystalline material used. It is also possible to carry out implantation at ambient temperature.

In order to obtain the maximum of implanted ions in a volume minimum, implantation of the ions advantageously takes place in a direction inclined with respect to the normal to the surface of the monocrystalline material. Bearing in mind the arrangement of the ions of the crystal lattice, this makes it possible to produce obstacles to the implanted ions, thus preventing the implantation thereof at an excessively deep level in the monocrystalline material. This angle of inclination must differ from zero and is e.g. equal to 7°.

Examples of ferroelectric monocrystalline materials to which the invention relates, reference can be made to ceramics or mixed oxides of niobium, tantalum, titanium, barium, etc. For example, it is possible to use lithium niobate ($LiNbO_3$), lithium tantalate ($LiTaO_3$), barium titanate ($BaTiO_3$), strontium and barium niobate ($Ba_2SrNb_5O_{15}$), potassium niobate ($KNbO_3$), as well as barium and sodium niobate ($Ba_2NaNb_5O_{15}$). Preference is given to the use of lithium niobate or lithium tantalate.

According to the invention, the dopant ions are metallic ions and in particular ions of transition metals able to take the place of a cation of the crystal lattice of the ferroelectric material, or sulphur ions able to take the place of the anion of the crystal lattice or the cation, as a function of its degree of oxidation.

In the case of a lithium niobate monocrystal, it is possible to use ions which can be substituted for $Nb^{5+}$ ions, such as e.g. ions of titanium, vanadium, nickel, iron, cobalt, zirconium, zinc, tantalum, chromium or ions of niobium, copper, gold, titanium or silver which can be substituted for $Li^+$ ions.

In the case of a lithium tantalate monocrystal, it is possible to use ions which can be substituted for tantalum ions, such as e.g. titanium or niobium ions, or ions such as of titanium or copper which can be substituted for $Li^+$ ions. Preferably, titanium is used for a lithium tantalate or niobate monocrystal.

In the case of a barium and strontium niobate monocrystal, it is possible to use ions which can be substituted for strontium or niobium, such as e.g. titanium or vanadium ions, or the sulphur ions for an oxygen substitution.

The process according to the invention more particularly relates to the production of a planar or strip-like optical guide. In this case, there are one or more successive implantations of the same dopant to form the guide layer of the optical guide. The number of implantations depends on the thickness of the guide layer which it is wished to obtain. In the case of several implantations, the energies and doses are successively modified so as to obtain a flat distribution of the desired dopants.

The process according to the invention also applies to a monocrystalline material having a guide layer able to carry a light signal. In this case, the implantation of the ions takes place in or in the vicinity of the guide layer with a view to modifying its guidance properties, e.g. for producing an index grating superimposed on the guide layer.

The implantation energies are advantageously between 100 keV and 2 MeV. The higher the implantation energy, the deeper the implanted material zone. An implantation energy below 100 keV is not adequate to permit a sufficient penetration of the ions, while an implantation energy above 2 MeV might damage the monocrystalline material.

The increases in the indexes of the monocrystalline material rise with the dose of implanted ions. In order to obtain an adequate index variation (at least 5%), use is made of implantation doses between $10^{15}$ and $10^{17}$ ions/$cm^2$ and preferably $5 \cdot 10^{15}$ to $5 \cdot 10^{16}$ ions/$cm^2$. An implantation dose above $10^{17}$ ions/$cm^2$ would lead to a partial destruction of the material.

In the particular case of a $LiNbO_3$ monocrystal and titanium dopant ions, the increase in the ordinary refractive index is at least +0.1, the ordinary index of the pure monocrystal being approximately 2.2.

Other features and advantages of the invention can be gathered from the following illustrative and non-limitative description with reference to the drawings, wherein show:

FIG. 1a The production of a flat optical guide as a result of the inventive process in a $LiNbO_3$.

Figure 1B:
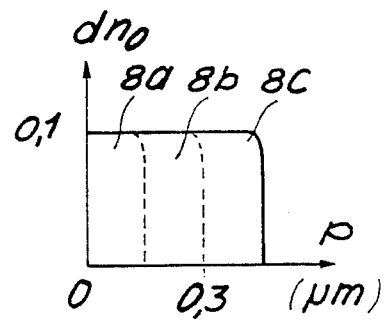

FIG. 1b The profile of the ordinary refractive index of the guide obtained.

Figure 2:
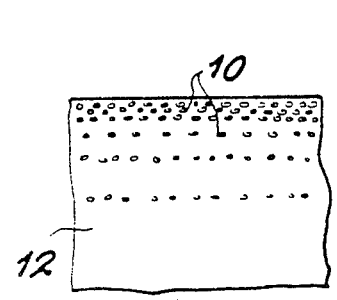

FIG. 2 The profile of the ordinary refractive index of a flat optical guide obtained by diffusion in a monocrystal according to the prior art.

Figure 3:
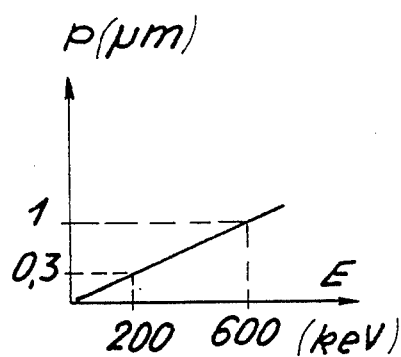

FIG. 3 The implantation depth as a function of the implantation energy according to the invention.

Figure 4:
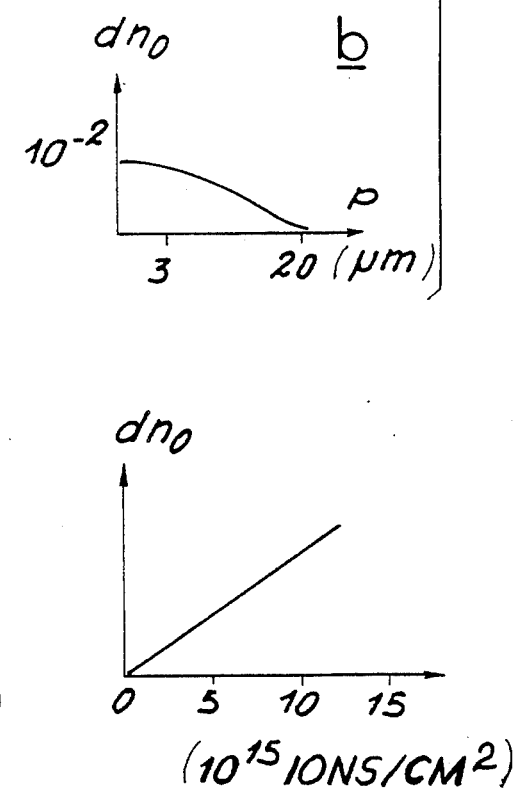

FIG. 4 The variations ($dn_o$) of the difference of the ordinary refractive indexes of the implanted layer and the undoped material as a function of the implanted ion dose according to the invention.

Figure 5:
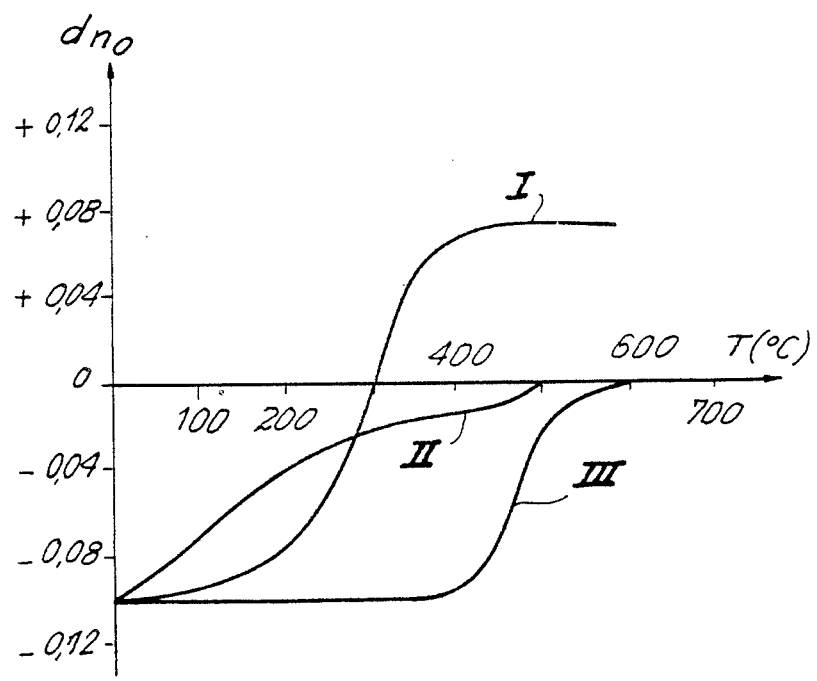

FIG. 5 The variation ($dn_o$) of the difference of the ordinary refractive indexes between the implanted layer and the undoped material as a function of the annealing temperature; curve I relating to the invention and curves II and III to an implantation of impurities according to the prior art.

Figure 6:
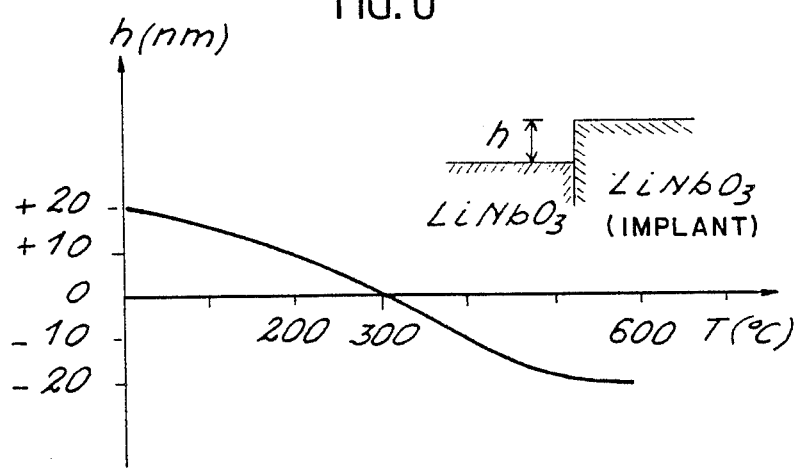

FIG. 6 Variations of the volume of the implanted monocrystal compared with the non-implanted monocrystal, as a function of the annealing temperature of the implanted monocrystal.

Figure 7:
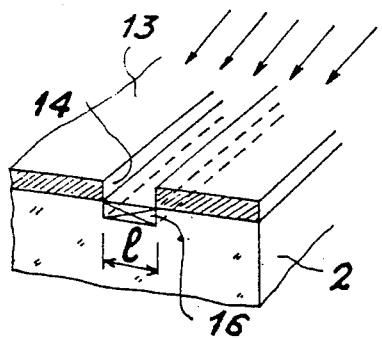

FIG. 7 Diagrammatically and in perspective, the production of a strip-like optical guide using the inventive process.

Figure 8:
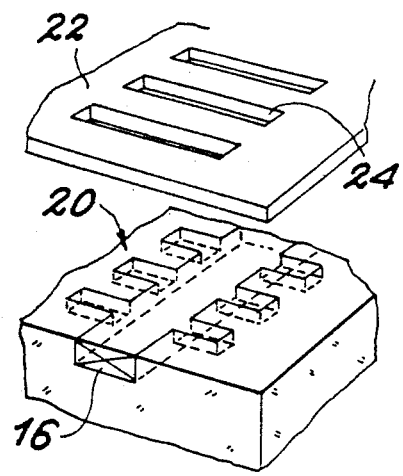

FIG. 8 Diagrammatically and in perspective, the production of a diffractive grating by the process according to the invention.

Figure 9:
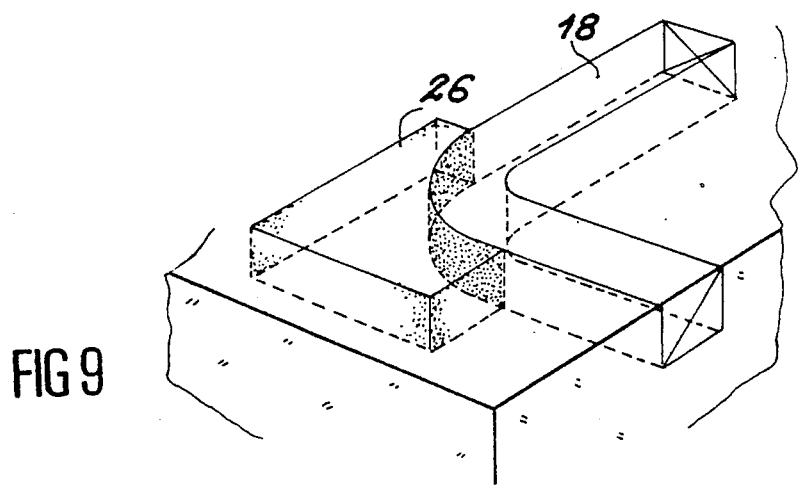

FIG. 9 In perspective, a curved optical guide obtained by the inventive process.

The production of a planar or flat guide according to the invention comprises, with reference to FIG. 1a, effecting in a ferroelectric monocrystal 2, e.g. of lithium niobate, a multi-implantation of a metallic dopant, e.g. titanium, leading to the obtention of an implanted surface layer 4 with ordinary and extraordinary refractive indexes above those of the non-implanted substrate 2. Implantation takes place in a vacuum enclosure where there is a pressure of approximately $5\times10^{-7}$ torr($5\times10^{-5}$Pa).

This implantation takes place with the aid of a Ti+ beam 6 resulting from the ionization of a $TiCl_4$ vapor. This ion beam forms an angle $\alpha$ with respect to the normal N to the monocrystal surface of approximately 7°. This inclination can be obtained by placing the monocrystal on an inclined support, whereof the surface forms an angle $\alpha$ relative to the horizontal. This is followed by annealing in the furnace for 60 mn at a temperature of 300° to 600° C. and e.g. at 400° C., under an oxygen flow of 1 liter mn at atmospheric pressure.

In order to obtain an adequate thickness of guide layer 4 to permit the transfer of a light signal in said layer, according to the invention several successive titanium implantations take place with rising energies and appropriate implantation doses to obtain the desired profile.

For example, to obtain a 0.7 micrometer layer 4, there is a first implantation of titanium 22 with an energy of 100 keV leading to the obtention of a 0.1 micrometer thick surface layer 4a, followed by a second titanium implantation at an energy of 200 keV permitting the obtention of an increase in the refractive indexes in a layer 4b, adjacent to layer 4a, up to a depth of 0.3 micrometer, followed by a third implantation at an energy of 500 keV leading to the formation of a layer 4c, adjacent to the layer 4b, at a depth of 0.7 micrometer in the monocrystal.

These successive implantations make it possible to obtain a planar profile of indexes and therefore an index hopping optical guide with an increase in the ordinary and extraordinary indexes greater than that obtained by the prior art diffusion method.

To this end, FIG. 1b shows the variations in the ordinary refractive index difference ($dn_o$) between the guide layer and the undoped material as a function of the implantation depth (P), expressed in micrometer. Curves 8a, 8b and 8c respectively represent the variations of $dn_o$ in implanted layers 4a, 4b, and 4c. Variations of the difference of the extraordinary indexes between the guide layer and the undoped material are similar.

The inventive process makes it possible to produce a waveguide with index hopping of limited thickness, contrary to the case of the process using diffusion which, as shown in FIG. 2, gives a waveguide with a limited index gradient over a great depth of close to 20 micrometer. Part a illustrates the diffusion of titanium ions 10 into a $LiNbO_3$ monocrystal 12 and part b gives the variations of the ordinary index ($dn_o$) as a function of the depth (P), expressed in micrometer, of the monocrystal. The optical guide was formed by depositing a 85 nm thick titanium layer on the surface of the monocrystal, then raising the assembly to 1000° C. for 16 hours.

As stated hereinbefore, the implantation depth is directly proportional to the implantation energy of the ions. This can be clearly gathered from the curve of FIG. 3 giving the implantation depth (P), expressed in micrometers, as a function of the implantation energy (E), expressed in keV.

According to the invention, the production of a surface guide by multiimplantation requires the use of the same dopant and implantation doses increasing at the same time as the energy. The implantation doses used are dependent on the increase in the refractive indices which it is wished to obtain in the monocrystal. Thus, as shown in FIG. 4, the ordinary (and extraordinary) index of the implanted material increases linearly as a function of the dose of implanted ions per square centimeter.

Moreover, the value of the ordinary and extraordinary indices obtained in the implanted layer increases with the annealing temperature. To this end, FIG. 5 shows the variations of $dn_o$ as a function of the annealing temperature, expressed in °C.

Curve I relates to a titanium implantation according to the invention in lithium niobate, at a dose of $10^{16}$ atoms/cm$^2$ and an energy of 190 keV. Curve II relates to the implantation of boron ions at a dose of $2\cdot10^{16}$ ions/cm$^2$ with an implantation energy between 120 and 140 keV, while curve III relates to an implantation of neon ions at a dose of $5\cdot10^{15}$ ions/cm$^2$ and an energy between 120 and 140 keV.

Curve I has a part located below the abscissa axis up to a temperature of 300° C. and then a part located above said axis. As from 300° C., the ordinary refractive index of the implanted layer and therefore the index difference $dn_o$ between the implanted layer and the remainder of the monocrystal increases with the annealing temperature. The difference in the ordinary refractive indexes between the implanted layer according to the prior art and the monocrystal decreases with the annealing temperature and is cancelled out at approximately 500° C. for curve II and at approximately 600° C. for curve III. As for curves II and III, the negative part of curve I corresponds to a crystalline disorder induced by implantation. The positive part of curve I corresponds to the activation of the implanted titanium ions as a result of the annealing, which corresponds to a partial substitution of the Nb or Li ions by Ti ions and/or to the filling of the monocrystal vacancies. The titanium ions are then located in the sites of the crystal lattice.

FIG. 6 gives the variations of the height (h), expressed in nm, separating the surface of the implanted material and that of the non-implanted material, as a function of the annealing temperature in °C. and also represents the activation of the ions implanted by annealing.

The positive part of the curve, corresponding to an increase in the volume of the monocrystal, results from the disorder of the implanted material, whereas the negative part corresponding to a decrease in the volume of the monocrystal results from the positioning in the cation or vacancy site of the titanium. As for curve I of the FIG. 5, the polarity change of the curve takes place at 300° C.

FIG. 7 shows the production in accordance with the invention of a strip or tape-like optical guide. In order to define the location and width of the guide layer, on the upper surface of the lithium niobate monocrystal 2 is e.g. produced a mask 13 having an opening 14 defining the width 1 of the guide layer to be produced. This mask can be a photosensitive resin mask or a metal mask, e.g. of gold, produced in per se known manner by photolithography. This is followed by a multiimplantation of titanium ions, as described relative to FIG. 1a. Following the elimination of mask 13 by chemical etching, annealing is carried out at between 300° and 600° C.

A guide layer 16 is then obtained with ordinary and extraordinary refractive indices above those of the non-implanted monocrystal and facing opening 14 of mask 13.

As a function of the shape of the mask opening 14, it is possible to produce a guide layer with any random shape, e.g. a parallelepipedic guide layer, as shown in FIG. 7, or as shown in FIG. 9 a curved guide layer 18. The shape of the guide layer is dependent on the integrated optical circuit which it is wished to produce.

In order to modify the guidance properties of the guide layer, it is possible to carry out another titanium implantation with a view to locally increasing the refractive index of said guide layer.

As shown in FIG. 8, it is e.g. possible to produce a diffractive grating 20 in guide layer 16 with a view e.g. to the selection of a particular light signal carried with several other signals by guide layer 16. This diffractive grating 20 is produced by forming a new implantation mask 22 on the surface of the monocrystal having longitudinal and parallel openings 24 defining the location and dimension of the grating slits and therefore the spacing or pitch of said grating.

Through said mask 22 is then carried out an implantation of titanium ions with a dose of $5 \cdot 10^{16}$ ions/cm$^2$ and an energy of 100 keV. According to the invention, said implantation takes place with an ion beam forming an angle of approxiamtely 70° to the normal with respect to the surface of the monocrystal. Following the elimination of mask 22, a further annealing of the material takes place at between 300° and 600° C.

In the case of a curved optical guide, like that shown in FIG. 9, it is possible to carry out a local modification 26 of the refractive index of the monocrystal, outside the bend or elbow of the guide layer 18, in order to reduce the propagation losses of the light transmitted by said curved guide. This local modification 26 is carried out by implanting in an inclined direction and through an appropriately shaped implantation mask, titanium ions at a dose of $10^{16}$ ions/cm$^2$ and an energy of 190 keV, followed by annealing at between 300° and 600° C., leading to an increase in the ordinary and extraordinary indexes of the monocrystal of $5 \cdot 10^{-2}$ over approximately 0.3 micrometer.

In the case of causing a local disturbance of the type shown in FIGS. 8 and 9, it is possible to produce the guide layer by titanium diffusion, in accordance with the prior art, when it is wished to obtain an index gradient optical guide.

Other local disturbance types for a waveguide which can be affected in accordance with the invention are an improvement to the interaction of the light with an electric field applied to the interior of the guide layer, e.g. with the aid of electrodes located on either side of said guide layer, by moving the guided mode of the surface of the guide layer towards the said guide layer surface as a result of a local increase in the refractive indices. This is particularly used for producing an electrooptical modulator.

Other applications of the inventive process can be envisaged without passing outside the scope of the invention.

The properties of the optical components and guides obtained by the inventive process have been regularly checked and after a test period of one year, no modification to these properties was detected.

We claim:

1. A process for producing an optical waveguide into the surface of a ferroelectric monocrystalline material, comprising essentially at least one ion implantation of sulfur or a metallic dopant liable to take the place of a cation of the crystal lattice of the material, said implantation taking place in vacuum and at the surface of said material at an inclined direction with respect to the normal to the surface of said material, and an annealing of the implanted material at a temperature from 300° to 600° C. in an oxygen atmosphere in order to rearrange the crystal lattice disturbed during implantation and to activate the implanted ions, while preventing the diffusion thereof into the material, in order to obtain an index hopping surface wave-guide which is thermally stable and has a surface implanted guide layer having ordinary and extraordinary positive refractive indexes respectively higher than the positive ordinary and extraordinary refractive indexes of the non-implanted material.

2. The process according to claim 1, characterized in that there are at least two successive implantations of said dopant at different doses and energies in order to form the optical waveguide.

3. The process according to claim 1, characterized in that the inclination is close to 7°.

4. The process according to claim 1, characterized in that the material is chosen from the group consisting of lithium niobate, lithium tantalate, barium titanate, strontium and barium niobate, potassium niobate and barium and sodium niobate.

5. The process according to claim 4, characterized in that the metallic dopant is an ion of a transition metal.

6. The process according to claim 4, characterized in that the metallic dopant is chosen from the group consisting of titanium, vanadium, nickel, iron, cobalt, silver, gold, niobium, tantalum, chromium, copper, zinc and zirconium.

7. The process according to claim 1, characterized in that the material is lithium niobate or lithium tantalate and the dopant is titanium.

8. The process according to claim 1, characterized in that the implantation energies are between 100 keV and 2 MeV.

9. The process according to claim 1, characterized in that the ion implantation dose is in the range from $5 \cdot 10^{15}$ to $5 \cdot 10^{16}$ ions/cm$^2$.

10. The process according to claim 1, characterized in that there are at least two successive implantations of said dopant at different doses and energies.

11. A process for producing an optical wave-guide into the surface of a ferroelectric monocrystalline material selected from the group consisting of lithium niobate, lithium tantalate, barium titanate, strontium and barium niobate, potassium niobate and barium and sodium niobate, comprising essentially at least one ion implantation of a transition metal dopant liable to take the place of a cation of the crystal lattice of the material, said implantation taking place in vacuum and at the surface of said material at an inclined direction with respect to the normal to the surface of said material, and an annealing of the implanted material at a temperature from 300° to 600° C. in an oxygen atmosphere in order to rearrange the crystal lattice disturbed during implantation and to activate the implanted ions, while preventing the diffusion thereof into the material and outdiffusion, in order to obtain an index hopping surface waveguide which is thermally stable and has a surface implanted guide layer having ordinary and extraordinary positive refractive indexes respectively higher than the positive ordinary and extraordinary refractive indexes of the non-implanted material.

12. The process according to claim 11, characterized in that the metallic dopant is chosen from the group consisting of titanium, vanadium, nickel, iron, cobalt, silver, gold, niobium, tantalum, chromium, copper, zinc and zirconium.

13. The process according to claim 11, characterized in that the material is lithium niobate or lithium tantalate and the dopant is titanium.

14. The process according to claim 11, characterized in that the inclination is close to 7°.

15. The process according to claim 11, characterized in that there are at least two successive implantations of said dopant at different doses and energies.

16. The process according to claim 11, characterized in that the implantation energies are between 100 keV and 2 MeV.

17. The process according to claim 11, characterized in that said implantation doses vary from $5 \cdot 10^{15}$ to $5 \cdot 10^{16}$ ions/cm$^2$.

* * * * *